US011442365B1

(12) United States Patent
Sun et al.

(10) Patent No.: US 11,442,365 B1
(45) Date of Patent: Sep. 13, 2022

(54) EUV PHOTOLITHOGRAPHY SYSTEM AND METHODS OF OPERATING THE SAME

(71) Applicant: Taiwan Semiconductor Manufacturing Co., Ltd., Hsinchu (TW)

(72) Inventors: Yu-Kuang Sun, Hsinchu (TW); Ming-Hsun Tsai, Hsinchu (TW); Yu-Huan Chen, Hsinchu (TW); Wei-Shin Cheng, Hsinchu (TW); Cheng-Hao Lai, Hsinchu (TW); Hsin-Feng Chen, Hsinchu (TW); Chiao-Hua Cheng, Hsinchu (TW); Cheng-Hsuan Wu, Hsinchu (TW); Yu-Fa Lo, Hsinchu (TW); Shang-Chieh Chien, Hsinchu (TW); Li-Jui Chen, Hsinchu (TW); Heng-Hsin Liu, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/459,836

(22) Filed: Aug. 27, 2021

(51) Int. Cl.
*G03F 7/20* (2006.01)
*H05G 2/00* (2006.01)

(52) U.S. Cl.
CPC ...... *G03F 7/70033* (2013.01); *G03F 7/70891* (2013.01); *G03F 7/70908* (2013.01); *G03F 7/70975* (2013.01); *H05G 2/005* (2013.01); *H05G 2/006* (2013.01); *H05G 2/008* (2013.01)

(58) Field of Classification Search
None
See application file for complete search history.

(56) References Cited

U.S. PATENT DOCUMENTS

| 9,544,982 | B2 | 1/2017 | Zhao et al. | |
|---|---|---|---|---|
| 10,481,498 | B2 | 11/2019 | Dijksman et al. | |
| 2012/0223256 | A1* | 9/2012 | Bykanov | H05G 2/005 250/504 R |
| 2019/0079401 | A1* | 3/2019 | Tsai | H05G 2/006 |
| 2019/0150266 | A1* | 5/2019 | Lai | G03F 7/70033 250/504 R |

* cited by examiner

*Primary Examiner* — Michelle M Iacoletti
(74) *Attorney, Agent, or Firm* — Seed IP Law Group LLP (57) ABSTRACT

A photolithography system utilizes tin droplets to generate extreme ultraviolet radiation for photolithography. The photolithography system irradiates the droplets with a laser. The droplets become energized and emit extreme ultraviolet radiation. A collector reflects the extreme ultraviolet radiation toward a photolithography target. The photolithography system isolates a source of droplets from oxidants to prevent the oxidation of the nozzle or the formation of metal oxides on the nozzle, both of which can adversely affect an ability of the nozzle to generate a sufficient amount of droplets and/or direct the droplets in a desired direction.

20 Claims, 6 Drawing Sheets

EUV PHOTOLITHOGRAPHY SYSTEM AND METHODS OF OPERATING THE SAME

BACKGROUND

Technical Field

The present disclosure relates to the field of photolithography. The present disclosure relates more particularly to extreme ultraviolet photolithography.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features on an integrated circuit die are produced, in part, with the aid of photolithography. Traditional photolithography techniques include generating a mask outlining the shape of features to be formed on an integrated circuit die. They photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet light is used to produce particularly small features due to the relatively short wavelength of extreme ultraviolet light. For example, extreme ultraviolet light is typically produced by irradiating droplets of selected materials with a laser beam. The energy from the laser causes the droplets to enter a plasma state. In the plasma state, the droplets emit extreme ultraviolet light. The extreme ultraviolet light travels toward a collector with an elliptical or parabolic surface. The collector reflects the extreme ultraviolet light onto the photolithography target.

DETAILED DESCRIPTION

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
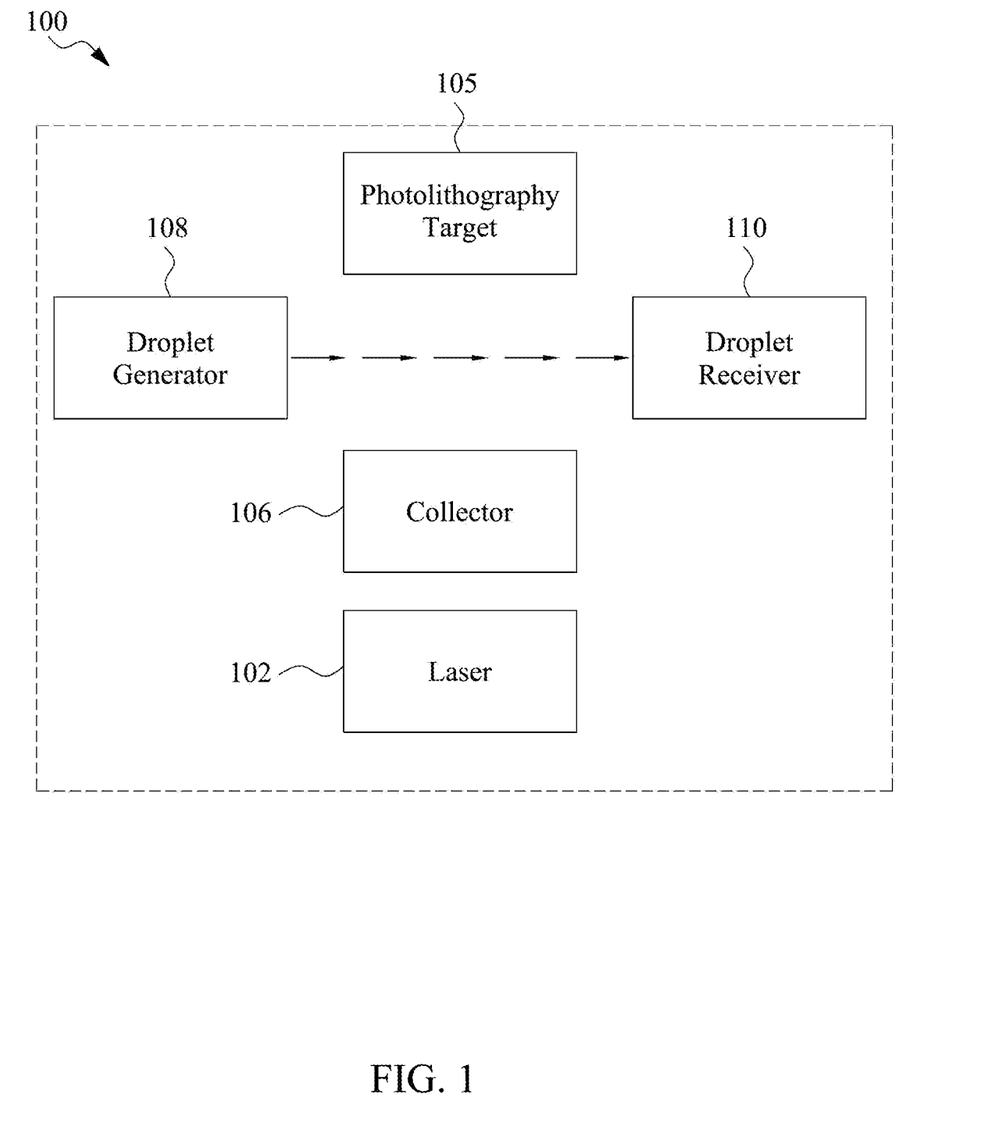
FIG. 1 is a block diagram of a photolithography system, according to one embodiment.

FIG. 1 is a block diagram of a photolithography system 100. The photolithography system 100 includes a laser 102, a photolithography target 105, a collector 106, a droplet generator 108, and a droplet receiver 110. The droplet receiver 110 includes a droplet pool (not shown in FIG. 1) in which the droplets received by the droplet receiver accumulate. The components of the photolithography system 100 cooperate to generate extreme ultraviolet (EUV) radiation which is used in an EUV photolithography process to pattern materials on the photolithography target.

The droplet generator 108 generates and outputs a stream of droplets. The droplets can include, in one example, liquid (melted) tin. Other materials can be used for the droplets without departing from the scope of the present disclosure. The droplets move at a high rate of speed toward the droplet receiver 110. The photolithography system 100 utilizes the droplets to generate extreme ultraviolet light for photolithography processes. Extreme ultraviolet light typically corresponds to light with wavelengths between 5 nm and 125 nm.

The laser 102 outputs a laser beam. The laser beam is focused on a point through which the droplets pass on their way from the droplet generator 108 to the droplet receiver 110. In particular, the laser 102 outputs laser pulses. Each laser pulse is received by a droplet. When the droplet receives the laser pulse, the energy from the laser pulse generates a high-energy plasma from the droplet. The high-energy plasma outputs extreme ultraviolet radiation.

In one embodiment, the radiation output by the plasma scatters randomly in many directions. The photolithography system 100 utilizes the collector 106 to collect the scattered extreme ultraviolet radiation from the plasma droplets and reflect the extreme ultraviolet radiation toward a photolithography target 105, or toward equipment that will guide the extreme ultraviolet radiation to the photolithography target 105.

In one embodiment, the collector 106 includes an aperture. The laser pulses from the laser 102 pass through the aperture toward the stream of droplets. This enables the collector 106 to be positioned between the laser 102 and the photolithography target 105.

After the droplets have been irradiated by the laser 102, the droplets continue with a trajectory toward the droplet receiver 110. The droplet receiver 110 receives the droplets in a droplet pool 116. The droplet pool 116 collects the droplets. The droplets can be drained from the droplet pool 116 and reused or disposed of.

Figure 2:
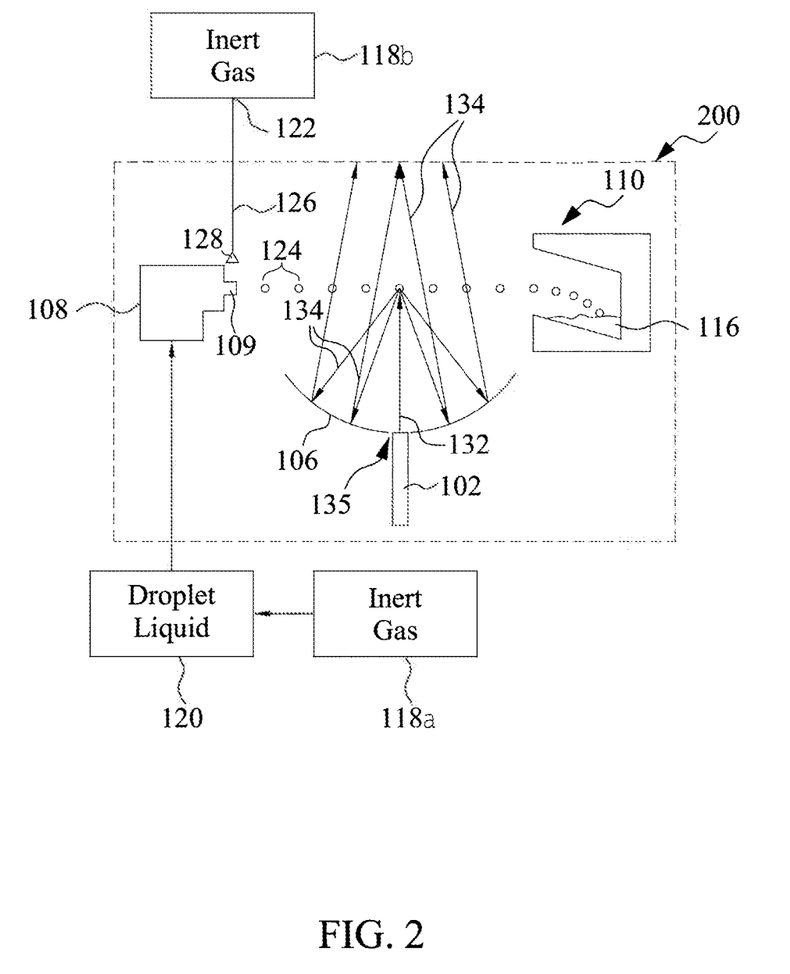
FIG. 2 is a block diagram of a photolithography system, according to one embodiment.

FIG. 2 is an illustration of a photolithography system 200, according to an embodiment of the present disclosure. The photolithography system 200 includes a laser 102, a collector 106, a droplet generator 108 including a droplet generator nozzle 109, a droplet receiver 110 including a droplet pool 116, a source of droplet liquid 120, and a first source of an inert gas 118a and a second source of inert gas 118b separate and distinct from the first source of inert gas 118a. By separate or distinct is meant the inert gas in the first inert gas source does not commingle with the inert gas in the second inert gas source or vice versa. In some embodiments, the first source of inert gas 118a and the second source of inert gas 118b are supplied for a central source of inert gas (not shown) or are the same reservoir of inert gas.

The droplet generator 108 generates and outputs a stream of droplets 124. The droplets are formed by driving a droplet liquid through a source of droplets, e.g., a droplet generator nozzle 109. The droplet liquid is supplied to the droplet generator 108 from a source of droplet liquid 120. The droplet liquid delivered to the droplet generator 108 is pressurized to drive the droplet liquid through the nozzle 109. In one embodiment, the source of droplet liquid 120 is in fluid communication with the first source of inert gas 118a. The inert gas exerts a pressure on the droplet liquid that is fed from the source of droplet liquid 120 to the droplet generator 108. In other embodiments the pressure exerted on the droplet liquid is supplemented by a mechanical device or energy. In other embodiments the pressure exerted on the droplet liquid is provided by a mechanical device or energy. The droplets can include, as described previously, tin. The droplets 124 ejected from nozzle 109 move at a high rate of speed toward the droplet receiver 110. The rate at which the droplets 124 are generated by droplet generator 108 is controlled and coordinated with pulsing of the laser 102 such that as many droplets as possible are irradiated a desired amount to generate the plasma which generates the EUV radiation. The droplet generator nozzle 109 ejects the droplets such that the droplets have X, Y and Z direction coordinates that cause as many, if not all, of the droplets to be received by the droplet receiver 110, such that the droplets do not impinge upon the reflective surface of collector 106 or other surfaces of the photolithography system 200 where deposition of the droplets is not desired.

The laser 102 is positioned behind a collector 106. The laser 102 outputs pulses of laser light 132. The pulses of laser light 132 are focused on a point through which the droplets pass on their way from the droplet generator nozzle 109 to the droplet receiver 110. Each pulse of laser light 132 is received by a droplet 124. When the droplet 124 receives the pulse of laser light 132, the energy from the laser pulse generates a high-energy plasma from the droplet 124. The high-energy plasma outputs extreme ultraviolet radiation.

In one embodiment, the laser 102 is a carbon dioxide (CO2) laser. The CO2 laser emits radiation or laser light 132 with a wavelength centered around 9.4 µm or 10.6 µm. The laser 102 can include lasers other than carbon dioxide lasers and can output radiation with other wavelengths than those described above without departing from the scope of the present disclosure.

In one embodiment the droplet generator 108 generates between 40,000 and 60,000 droplets per second. The droplets 124 have an initial velocity of between 70 m/s and 90 m/s. The droplets have a diameter between 10 µm and 200 µm. The droplet generator 108 can generate different numbers of droplets per second than described above without departing from the scope of the present disclosure. The droplet generator 108 can also generate droplets having different initial velocities and diameters than those described above without departing from the scope of the present disclosure.

In one embodiment, the laser 102 irradiates each droplet 124 with two pulses. A first pulse causes the droplet 124 to flatten into a disk like shape. The second pulse causes the droplet 124 to form a high temperature plasma. The second pulse is significantly more powerful than the first pulse. The laser 102 and the droplet generator 108 are calibrated so that the laser 102 emits pairs of pulses such that each droplet 124 is irradiated with a pair of pulses. For example, if the droplet generator 108 outputs 50,000 droplets per second, the laser 102 will output 50,000 pairs of pulses per second. The laser 102 can irradiate droplets 124 in a manner other than described above without departing from the scope of the present disclosure. For example, the laser 102 may irradiate each droplet 124 with a single pulse or with more pulses than two.

In one embodiment, the droplets 124 are tin. When the tin droplets 124 are converted to a plasma, the tin droplets 124 output extreme ultraviolet radiation 134 with a wavelength centered between 10 nm and 15 nm. More particularly, in one embodiment the tin plasma shines with a characteristic wavelength of 13.5 nm. These wavelengths correspond to extreme ultraviolet radiation. Materials other than tin can be used for the droplets 124 without departing from the scope of the present disclosure. Such other materials may generate extreme ultraviolet radiation with wavelengths other than those described above without departing from the scope of the present disclosure.

In one embodiment, the radiation 134 output by the droplets scatters randomly in many directions. The photolithography system 100 utilizes the collector 106 to collect the scattered extreme ultraviolet radiation 134 from the plasma and output the extreme ultraviolet radiation toward a photolithography target 105.

In one embodiment, the collector 106 is a parabolic or elliptical mirror. The scattered radiation 134 is collected and reflected by the parabolic or elliptical mirror with a trajectory toward a photolithography target 105.

In one embodiment, the collector 106 includes an aperture 135. The pulses of laser light 132 pass from the laser 102 through the aperture 135 toward the stream of droplets 124. This enables the collector 106 to be positioned between the laser 102 and the photolithography target 105.

After the droplets 124 have been irradiated by the laser 102, the droplets 124 continue with a trajectory toward the droplet receiver 110. In particular, the droplets enter the droplet receiver 110 and travel through an interior passage toward a droplet pool 116 at a back end of the droplet receiver 110. The droplet pool 116 collects the droplets 124. The droplet receiver 110 can further include a drain port (not shown) that drains the droplet pool 116. The droplets 124 can be reused or disposed of.

The second inert gas source 118b is connected to an inlet 122 of a conduit 126 that carries inert gas to an outlet 128. In the illustrated embodiment, outlet 128 is located adjacent to nozzle 109. In other embodiments, the outlet 128 is not located adjacent to nozzle 109; however, it is positioned in a location such that inert gas exiting outlet 128 forms a cloud (130 in FIG. 3) of inert gas around nozzle 109. For example, in one embodiment, the outlet 128 is in fluid communication with a chamber in which the nozzle 109 is located.

Figure 3:
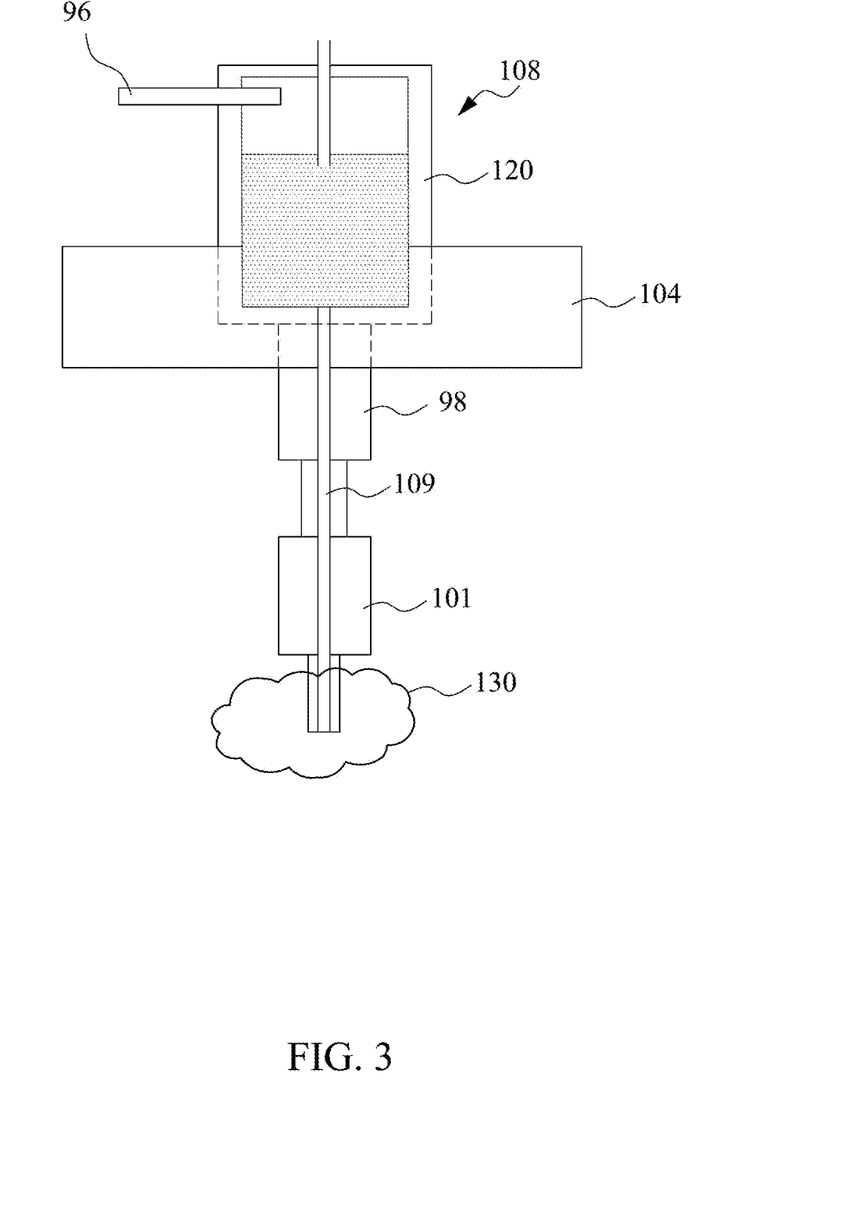
FIG. 3 is a schematic view of a portion of a droplet generator including a source of droplet liquid and a nozzle

FIG. 3 shows in greater detail a portion of a droplet generator 108 for generating droplets. For the generalized embodiment shown in FIG. 3, droplet generator 108 includes a reservoir 120 holding a molten droplet liquid material such as tin. Heating elements (not shown) controllably maintain portions of the droplet generator 108 at a temperature above the melting temperature of the material comprising the droplet liquid. The molten droplet material may be placed under pressure by using an inert gas such as argon from first inert gas source 118a. The pressure preferably forces the molten droplet material to pass through a set of filters 98. From the filters 98, the material may pass through a valve 101 to a nozzle 109. For example valve 101 may be a thermal valve. A Peltier device may be employed to establish the valve 101, freezing target material between the filters 98 and nozzle 109 to close the valve 101 and heating the solidified target material to open the valve 101. FIG. 3 also shows that the droplet generator 108 includes a movable member 104 such that motion of the movable member 104 changes the position of the point at which droplets are released from the nozzle 109. Motion of the movable member 104 is controlled by a droplet release point positioning system (not shown). The inert gas is not limited to argon and maybe helium or nitrogen or another gas that does not react with tin to form oxides of tin or does not react with the nozzle to form oxides of the material from which the nozzle 109 is manufactured. During maintenance of the droplet generator, the inert gas from inert gas source 118a flows through droplet generator 108 and out nozzle 109. Pressure of the inert gas flowed through droplet generator 108 is controlled to be slightly above the internal pressure of the chamber containing the droplet generator 108 as such that the inert gas exiting nozzle 109 forms a cloud 130 around nozzle 109. As described below in more detail, this volume of inert gas around nozzle 109 serves to isolate nozzle 109 from oxidants that may be present in the vicinity of nozzle 109 during maintenance of the droplet generator. In addition, flowing inert gas through nozzle 109 in the absence of the droplet liquid, facilitates the removal of thermal energy from the nozzle 109, i.e., cooling the nozzle 109, which can help to reduce the time required to reduce the temperature of the nozzle 109 to a level where maintenance can be performed. Reducing the amount of time required to reduce the temperature of the nozzle 109 to a level where maintenance can be performed will have the effect of reducing the overall time required to maintenance the nozzle and droplet generator. In accordance with another embodiment, the removal of thermal energy from, e.g., cooling of, the nozzle 109 and isolating nozzle 109 from oxidants during maintenance is achieved by flowing in inert gas from the second source of inert gas 118b through outlet 128 of conduit 126. In some embodiments, the second source of inert gas 118b is the same source of inert gas as the first source of inert gas 118a. In other embodiments the second source of inert gas 118b is a source of inert gas different from the first source of inert gas 118a. Providing a second source of inert gas different from the first source of inert gas provides the operator the flexibility of using an inert gas during maintenance that is different than the inert gas used during normal operation of the droplet generator. As with flowing inert gas through nozzle 109, the pressure of the inert gas exiting outlet 128 of conduit 126 is such that the inert gas exiting outlet 128 forms a cloud 130 of inert gas around nozzle 109. In other embodiments, when maintenance of the droplet generator does not result in the nozzle being exposed to oxidants, forming the cloud 130 of inert gas around nozzle 109 still provides a benefit of shortening the time required to cool the nozzle 109 to a temperature where maintenance can be performed.

For the droplet generator 108, one or more modulating or non-modulating droplet liquid dispensers may be used. For example, a modulating dispenser may be used having a capillary tube formed with an orifice. The nozzle 109 may include one or more electro-actuatable elements, e.g. actuators made of a piezoelectric material, which can be selectively expanded or contracted to deform the capillary tube and modulate a release of source material from the nozzle 109.

As stated, the droplets are released by a nozzle 109. To be useful as a nozzle, the nozzle preferably is able to operate at relatively high pressures, for example, from about 6000 pounds per square inch to about 8000 pounds per square inch. It should also be able to operate despite the possible presence of particles in the fluid supplied to the nozzle or at the nozzle head, a characteristic referred to as low sensitivity to particles. It is also preferable that the nozzle permit good control over the exit angle and velocity of the droplets. It is also preferable that the nozzle enable flexibility in permitting multiple design options for coupling the nozzle to other components in the system, in particular, to elements that are provided to modulate the droplet stream.

During periodic maintenance of a droplet generator when portions of the droplet generator are exposed to oxygen, oxidation of the nozzle of the droplet generator or the formation of oxides of the droplet liquid on the nozzle can negatively affect the ability of the nozzle to generate a sufficient number of droplets and/or to direct the droplets in a desired direction. For example, formation of tin oxide on the nozzle, especially in or directly adjacent to the opening through which the droplet liquid is ejected to form the droplets, can cause the droplets to travel in a path that prevents the laser from irradiating the droplets. When this occurs, a plasma is not formed at the droplet and therefore, a reduced amount of extreme ultraviolet radiation is generated. A reduced amount of extreme ultraviolet radiation may also occur when the frequency with which the droplets are generated by the nozzle is reduced or becomes erratic. Such reductions or instability of the generation of extreme ultraviolet radiation causes the dosing of extreme ultraviolet radiation through the reticle to be reduced or become unstable which adversely affects the dose of extreme ultraviolet radiation that is applied to the substrate. This can result in incomplete development of the patterns on the substrate. Other adverse impacts of oxidation of the nozzle or formation of metal oxides on the nozzle include the droplets from the nozzle traveling at angles such that the droplets are unable to be received in the droplet receiver and thus contaminate unwanted portions of the droplet generator.

In accordance the present disclosure, the nozzle's resistance to oxidation or the formation of metal oxides on the nozzle, e.g., during periodic maintenance, is improved by the methods described herein.

Figure 4:
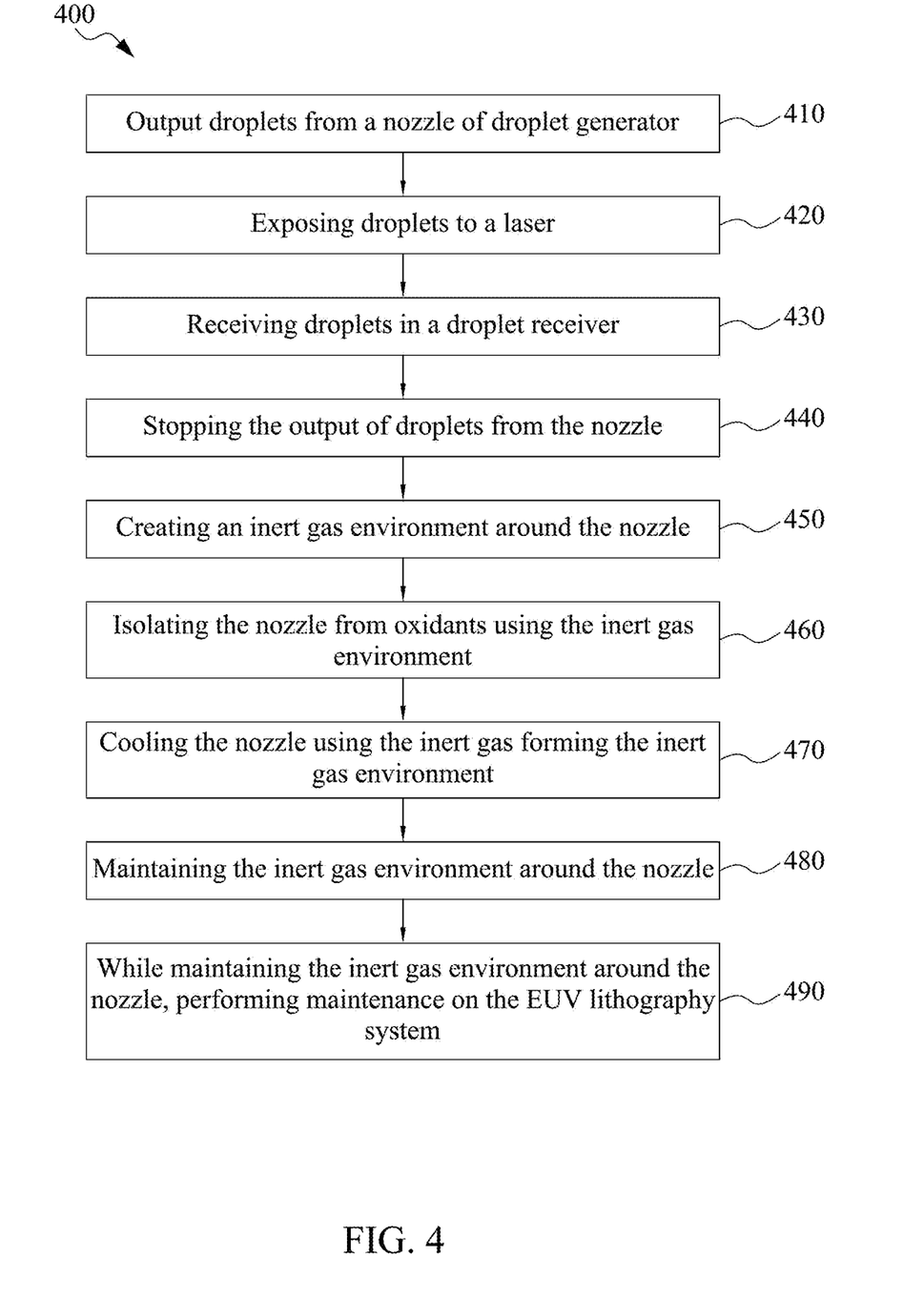
FIG. 4 is a flow diagram of a method in accordance with an embodiment of the present disclosure.

FIG. 4 is a flow diagram of a method 400 for operating an EUV photo lithography system which includes isolating a nozzle of a droplet generator from oxidants and cooling a nozzle of a droplet generator, e.g., during maintenance of the droplet generator in accordance with an embodiment of the present disclosure. At 410, the method 400 includes outputting a stream of droplets from a droplet generator. One example of a droplet generator is the droplet generator 108 of FIG. 3. At 420, the method 400 includes irradiating the droplets with a laser. One example of a laser is a laser 102 of FIG. 1 or FIG. 2. At 430, the method 400 includes receiving the droplets in a droplet receiver. One example of a droplet receiver is the droplet receiver 110 of FIG. 1 or FIG. 2. At 440, the method 400 includes stopping the output of droplets from the nozzle. In accordance with one embodiment, stopping the output of droplets from the nozzle is accomplished by either stopping the flow of droplet liquid to the nozzle by removing pressure applied to the droplet liquid or by isolating the nozzle from the droplet liquid. At 450, the method 400 includes creating an inert gas environment around the nozzle. Examples of creating an inert gas environment around the nozzle include flowing inert gas through the nozzle in the absence of the droplet liquid or supplying the inert gas from a secondary inert gas source 118*b* through conduit 126 in FIG. 2. As described above, the secondary inert gas source 118*b* maybe the same as or it may be different than the first inert gas source 118*a*. At 460 the inert gas environment around the nozzle isolates the nozzle from oxidants that the nozzle would otherwise be exposed to. Isolating the nozzle from oxidants reduces the likelihood that materials from which the nozzle is formed oxidize or that metals contained in the liquid droplets will oxidize and deposit onto the nozzle and adversely affect the ability of the nozzle to generate droplets. At 470, the flow of the inert gas through the nozzle or the flow of inert gas from the outlet 128 around the nozzle contributes to the cooling of the nozzle. At 480, the method 400 maintains the established inert gas environment around the nozzle. At 490, the method 400 includes, while the inert gas environment around the nozzle is maintained, performing maintenance on the EUV photolithography system. In accordance with this method, the nozzle is protected from damage or alteration which can affect the ability of the nozzle to produce a sufficient amount of droplets as well as to produce droplets that travel in the appropriate direction. In addition, in accordance with this embodiment of methods described herein, the cycle time needed to complete a periodic maintenance of the droplet generator is reduced due to the reduced time required to cool the droplet generator to a temperature sufficient to perform maintenance thereon.

Figure 5:
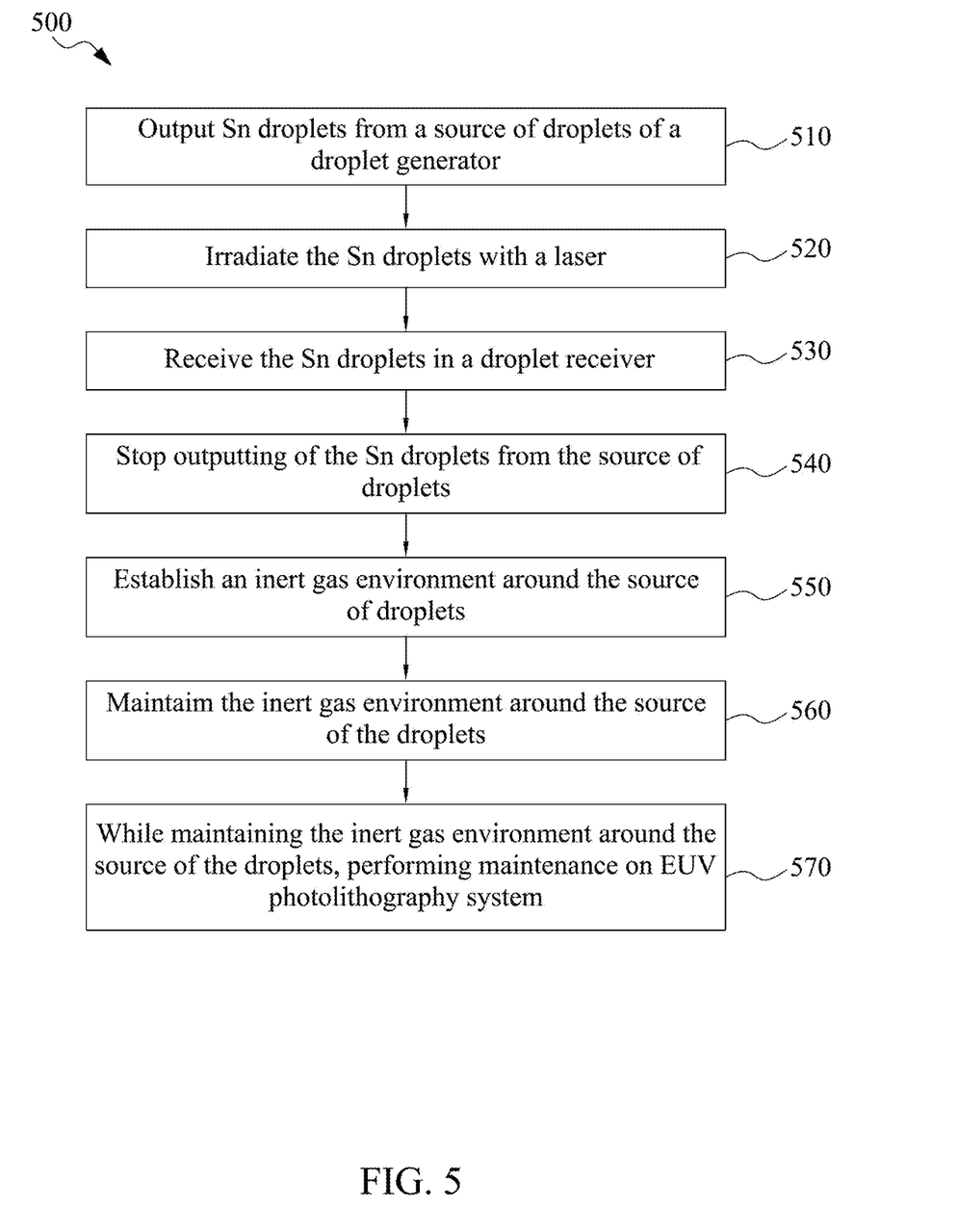
FIG. 5 is a flow diagram of a method in accordance with an embodiment of the present disclosure.

FIG. 5 is a method 500 for operating an EUV photolithography system, according to an embodiment. At 510, the method 500 includes outputting a plurality of Sn droplets from a source of droplets, e.g., a droplet nozzle, of a droplet generator. One example of a droplet generator is the droplet generator 108 of FIG. 1 or FIG. 2. One example of a droplet nozzle is the droplet nozzle 109 of FIG. 3. At 520, the method 500 includes irradiating the Sn droplets with a laser. One example of a laser is the laser 102 of FIG. 1 or FIG. 2. At 530, the method 500 includes inducing receiving the Sn droplets in a droplet receiver. An example of a droplet receiver includes the droplet receiver 110 of FIG. 1 or FIG. 2. At 540, the method 500 includes stopping output of the Sn droplets from the source of droplets. An example of stopping output of the Sn droplets from the source of droplets includes stopping the flow of droplet liquid from droplet liquid source 120 in FIG. 2 or FIG. 3 to nozzle 109 in FIG. 2 or FIG. 3. Such stoppage of flow can be accomplished by isolating the droplet liquid source 120 from the nozzle 109. In this embodiment inert gas may flow through the nozzle 109. In an alternative embodiment, the stoppage of flow can be accomplished by reducing the pressure on the droplet liquid in the droplet liquid source 120 such that the droplet liquid is not driven to flow out the nozzle 109. At 550, the method 500 includes establishing an inert gas environment around the source of droplets. Examples of creating an inert gas environment around the source of droplets includes flowing inert gas through the source of droplets in the absence of the droplet liquid or supplying the inert gas from a secondary inert gas source 118*b* through conduit 126 in FIG. 2. As described above, the secondary inert gas source 118*b* maybe the same as or it may be different than the first inert gas source 118*a*. At 560, the method 500 includes maintaining the established inert gas environment around the source of droplets. At 570, the method 500 includes performing maintenance on the EUV photolithography system, while the inert gas environment around the source of droplets is maintained, maintenance is performed on the EUV photolithography system. In accordance with this method, the inert gas environment protects the source of droplets from damage or alteration which can affect the ability of the nozzle to produce a sufficient amount of droplets as well as to produce droplets that travel in the appropriate direction. In addition, in accordance with this embodiment of methods described herein, the cycle time needed to complete a periodic maintenance of the droplet generator is reduced due to the reduced time required to cool the droplet generator to a temperature sufficient to perform maintenance thereon.

Figure 6:
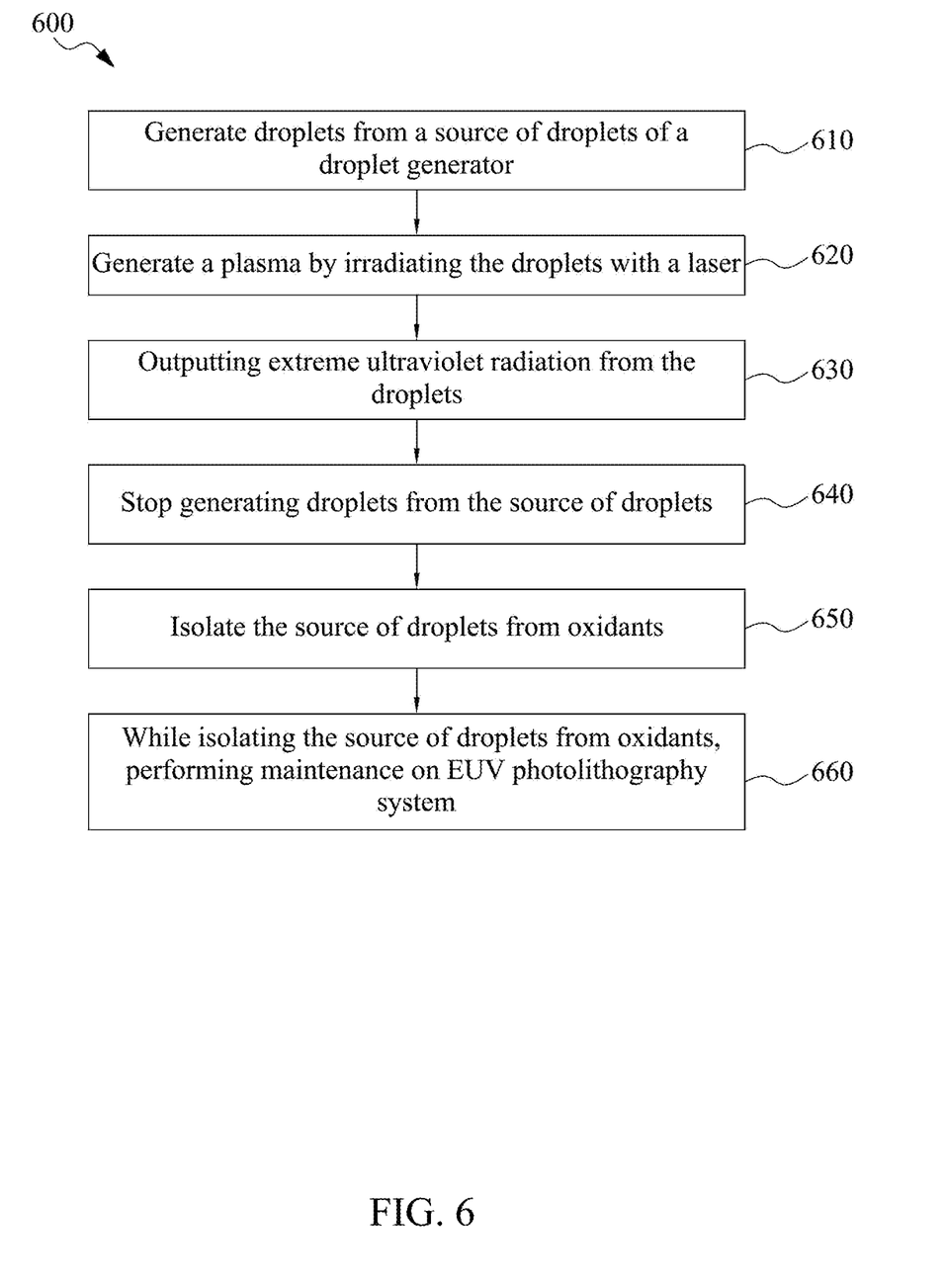
FIG. 6 is a flow diagram of a method in accordance with an embodiment of the present disclosure.

FIG. 6 is a method 600 for operating an EUV photolithography system, according to an embodiment. At 610, the method 600 includes generating a plurality of droplets from a source of droplets, e.g., a droplet nozzle, of a droplet generator. One example of a droplet generator is the droplet generator 108 of FIG. 1 or FIG. 2. One example of a droplet nozzle is the droplet nozzle 109 of FIG. 3. At 620, the method 600 includes irradiating the droplets with a laser. One example of a laser is the laser 102 of FIG. 1 or FIG. 2. At 630, the method 600 includes outputting extreme ultraviolet radiation from the irradiated droplets. At 640, the method 600 includes stopping the generation of droplets from the source of droplets. An example of stopping the generation of droplets from the source of droplets includes stopping the flow of droplet liquid from droplet liquid source 120 in FIG. 2 or FIG. 3 to nozzle 109 in FIG. 2 or FIG. 3. Such stoppage of flow can be accomplished by isolating the droplet liquid source 120 from the nozzle 109. In this embodiment inert gas may flow through the nozzle 109. In an alternative embodiment, the stoppage of flow can be accomplished by reducing the pressure on the droplet liquid in the droplet liquid source 120 such that the droplet liquid is not driven to flow out the nozzle 109. At 650, the method 600 includes isolating the source of droplets from oxidants, e.g., using the inert gas environment established around the source of droplets. Examples of creating an inert gas environment around the source of droplets includes flowing inert gas through the source of droplets in the absence of the droplet liquid or supplying the inert gas from a secondary inert gas source 118b through conduit 126 in FIG. 2. As described above, the secondary inert gas source 118b maybe the same as or it may be different from the first inert gas source 118a. At 660, the method 600 includes performing maintenance on the EUV photolithography system, while the inert gas environment isolates the source of droplets from oxidants. In accordance with this method, the inert gas environment isolates the source of droplets oxidants that can damage or alter the nozzle in a way which can affect the ability of the nozzle to produce a sufficient amount of droplets as well as to produce droplets that travel in the appropriate direction.

In one embodiment, a method includes outputting droplets from a nozzle of a droplet generator of an EUV photolithography system. The output droplets are exposed to a laser which causes the droplets to emit EUV radiation. The irradiated droplets are received in a droplet receiver of the EUV photolithography system. Output of the droplets from the nozzle is stopped and an inert gas environment is created around the nozzle in order to protect the nozzle from oxidants and to promote cooling of the nozzle. This inert gas environment around the nozzle is maintained while performing maintenance on the EUV photolithography system.

In one embodiment, a method includes outputting Sn droplets from a source of droplets of a droplet generator. The droplet generator may be part of an EUV photolithography system. The generated Sn droplets are irradiated with a laser which causes the Sn droplets to form a plasma which emits EUV radiation. In accordance with this embodiment, the output of the Sn droplets is stopped and an inert gas environment is established around the source of droplets. In accordance with this embodiment, the inert gas environment around the source of droplets is maintained while performing maintenance on the EU photolithography system.

In one embodiment an EUV photolithography system is described and includes a chamber containing a droplet generator. The droplet generator includes a droplet generating nozzle. The droplet generating nozzle is in fluid communication with a droplet liquid reservoir. A first source of inert gas is in fluid communication with the droplet liquid reservoir. A second source of inert gas is in fluid communication with the chamber, the second source of inert gas being distinct from the first source of inert gas.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of operating an EUV photolithography system, the method comprising:
 outputting droplets from a nozzle of a droplet generator of the EUV photolithography system;
 exposing the droplets to a laser of the EUV photolithography system;
 receiving the droplets in a droplet receiver of the EUV photolithography system;
 stopping the outputting of the droplets from the nozzle;
 creating an inert gas environment around the nozzle by flowing an inert gas through the nozzle;
 isolating the nozzle from oxidants using the inert gas environment;
 cooling the nozzle using the inert gas forming the inert gas environment around the nozzle;
 maintaining the inert gas environment around the nozzle; and
 while maintaining the inert gas environment around the nozzle, performing maintenance on the EUV photolithography system.

2. The method of claim 1, wherein the inert gas environment includes an inert gas selected from argon, helium or nitrogen.

3. The method of claim 1, wherein creating an inert gas environment around the nozzle includes delivering an inert gas into a chamber including the nozzle.

4. The method of claim 3, wherein delivering the inert gas into the chamber including the nozzle includes maintaining a pressure of the inert gas within the chamber at 1 atm or greater.

5. The method of claim 1, wherein flowing an inert gas through the nozzle includes maintaining a pressure of the inert gas flowing through the nozzle at a pressure of 1 atm or greater.

6. The method claim 5, wherein creating an inert gas environment around the nozzle includes creating an argon gas environment around the nozzle.

7. The method of claim 1, wherein outputting droplets from a nozzle of a droplet generator includes pressurizing a droplet liquid with an inert gas from a first source of inert gas and creating an inert gas environment around the nozzle includes creating an inert gas environment around the nozzle using an inert gas from a second inert gas source, the second inert gas source being separate from the first inert gas source.

8. The method of claim 1, wherein maintaining the inert gas environment around the nozzle includes maintaining a humidity around the nozzle that is lower than the humidity around the nozzle during the outputting droplets from the nozzle.

9. The method claim 1, wherein the exposing the droplets to a laser includes exposing the droplets to a CO2 laser.

10. A method comprising:
outputting Sn droplets from a source of droplets of a droplet generator in an EUV photolithography system;
irradiating the Sn droplets with a laser;
receiving the Sn droplets in a droplet receiver;
stopping the outputting of the Sn droplets from the source of droplets;
establishing an inert gas environment around the source of droplets by flowing an inert gas through an outlet of the source of droplets;
maintaining the inert gas environment around the source of the droplets; and
while maintaining the inert gas environment around the source of the droplets, performing maintenance on the EUV photolithography system.

11. The method of claim 10, wherein the droplet generator is a Sn droplet generator.

12. The method of claim 10, further comprising absorbing, by the inert gas used to establish the inert gas environment, thermal energy from the source of the droplets.

13. The method of claim 10, wherein maintaining the inert gas environment around the source of the droplets includes isolating the source of the droplets from oxidants.

14. The method of claim 13, wherein isolating the source of the droplets from oxidants includes isolating the source of droplets from oxygen.

15. The method of claim 10, wherein irradiating the Sn droplets with a laser, includes irradiating the Sn droplets with a CO2 laser.

16. The method of claim 10, wherein establishing the inert gas environment around the source of droplets includes establishing an argon gas environment around the source of droplets.

17. The method of claim 10, wherein maintaining the inert gas environment around the source of droplets includes maintaining a humidity around the source of droplets that is lower than the humidity around the source of droplets during the outputting droplets from the source of droplets.

18. A method of operating an EUV photolithography system, the method comprising:
generating droplets from a source of droplets of the EUV photolithography system;
stopping the generating droplets from the source of droplets;
isolating the source of droplets from oxidants by flowing an inert gas through an outlet of the source of droplets and creating a cloud of inert gas around the outlet of the source of droplets; and
while isolating the source of droplets from oxidants, performing maintenance on the EUV photolithography system.

19. The method of claim 18, wherein the isolating the source of droplets from oxidants includes forming an inert gas environment around the source of droplets.

20. The method of claim 19, further comprising cooling the source of droplets using an inert gas of the inert gas environment.

* * * * *